United States Patent
Laermer et al.

(10) Patent No.: US 7,872,333 B2
(45) Date of Patent: Jan. 18, 2011

(54) LAYER SYSTEM COMPRISING A SILICON LAYER AND A PASSIVATION LAYER, METHOD FOR PRODUCTION A PASSIVATION LAYER ON A SILICON LAYER AND THE USE OF SAID SYSTEM AND METHOD

(75) Inventors: Franz Laermer, Weil Der Stadt (DE); Lutz Mueller, Aichtal (DE); Winfried Bernhard, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 479 days.

(21) Appl. No.: 10/524,610

(22) PCT Filed: May 6, 2003

(86) PCT No.: PCT/DE03/01437
§ 371 (c)(1),
(2), (4) Date: Aug. 11, 2005

(87) PCT Pub. No.: WO2004/018348
PCT Pub. Date: Mar. 4, 2004

(65) Prior Publication Data
US 2006/0108576 A1    May 25, 2006

(30) Foreign Application Priority Data
Aug. 17, 2003 (DE) ............................ 102 37 787

(51) Int. Cl.
*H01L 23/58* (2006.01)
*H01L 21/70* (2006.01)
*H01L 29/06* (2006.01)

(52) U.S. Cl. ............ 257/642; 257/513; 257/622; 257/626; 257/647; 257/E23.002; 257/E21.546; 438/437; 438/719; 438/958

(58) Field of Classification Search ............ None
See application file for complete search history.

(56) References Cited

U.S. PATENT DOCUMENTS 5,233,181 A * 8/1993 Kwansnick et al. ...... 250/208.1

(Continued)

FOREIGN PATENT DOCUMENTS

DE    42 41 045    12/1992

(Continued)

OTHER PUBLICATIONS

Furuya et al. Fluorinated polyimide fabrication by magnetically controlled reactive ion etching (MC RIE). 1994. J. Micromech. Microeng. vol. 4, pp. 67-73.*

(Continued)

*Primary Examiner*—Steven Loke
*Assistant Examiner*—Hoang-Quan T Ho
(74) *Attorney, Agent, or Firm*—Kenyon & Kenyon LLP

(57) ABSTRACT

A layer system is described including a silicon layer and a passivation layer which is applied at least regionally to the silicon layer's surface, the passivation layer having a first, at least largely inorganic partial layer and a second partial layer, the second partial layer being made of an organic compound including silicon or containing such a material. In particular, the second partial layer is structured in the form of a "self-assembled monolayer." Furthermore, a method is described for creating a passivation layer on a silicon layer, a first, inorganic partial layer being created on the silicon layer and a second partial layer, containing an organic compound including silicon or being made thereof, being created at least in certain areas on the first partial layer. Both partial layers form the passivation layer. The described layer system or the described method is particularly suited for creating self-supporting structures in silicon.

11 Claims, 1 Drawing Sheet

U.S. PATENT DOCUMENTS

| | | | | |
|---|---|---|---|---|
| 5,604,380 | A | * | 2/1997 | Nishimura et al. ........... 257/758 |
| 5,646,439 | A | | 7/1997 | Mori et al. ................... 257/632 |
| 5,932,485 | A | | 8/1999 | Schofield ..................... 438/690 |
| 6,258,407 | B1 | * | 7/2001 | Lee et al. ................ 427/255.28 |
| 6,323,131 | B1 | * | 11/2001 | Obeng et al. ................. 438/687 |
| 6,383,920 | B1 | | 5/2002 | Wang et al. .................. 438/725 |
| 6,387,819 | B1 | | 5/2002 | Yu .............................. 438/725 |
| 7,229,910 | B2 | * | 6/2007 | Usami ......................... 438/624 |
| 7,642,545 | B2 | * | 1/2010 | Urban et al. ................... 257/40 |
| 2002/0140103 | A1 | * | 10/2002 | Kloster et al. ............... 257/767 |
| 2002/0158339 | A1 | * | 10/2002 | Yamamoto .................. 257/758 |
| 2003/0013272 | A1 | * | 1/2003 | Hong et al. .................. 438/437 |
| 2005/0074919 | A1 | * | 4/2005 | Patel et al. ................... 438/107 |
| 2006/0068510 | A1 | * | 3/2006 | Urban et al. ..................... 438/6 |
| 2006/0108576 | A1 | * | 5/2006 | Laermer et al. ................ 257/40 |

FOREIGN PATENT DOCUMENTS

| | | | |
|---|---|---|---|
| DE | 44 20 962 | | 12/1995 |
| DE | 197 06 682 | | 8/1998 |
| DE | 198 47 455 | | 4/2000 |
| EP | 0 822 586 | | 2/1998 |
| EP | 0822586 | * | 2/1998 |
| JP | 5-217961 | | 8/1993 |
| JP | 7-106328 | | 4/1995 |
| JP | 7106328 | | 4/1995 |
| JP | 07-095306 | * | 11/1996 |
| JP | 9-82704 | | 3/1997 |
| JP | 10-74755 | | 3/1998 |
| JP | 10074755 | | 3/1998 |
| WO | WO 00/023376 | | 4/2000 |
| WO | WO 02/05349 | | 1/2002 |

OTHER PUBLICATIONS

Tetsuya Homma. Fluorinated interlayer dielectric films in ULSI multilevel interconnections. 1995. Journal of Non-Crystalline Solids. 187. pp. 49-59.*

Nguyen Nhu, Toan. Spin-On Glass Materials and Applications in Advanced IC Technologies. 1999. Thesis. Retrieved from the Internet<URL:http://doc.utwente.nl/14094/>.*

Homma et al. Stability of a new polyimide siloxane film as interlayer dielectrics of ULSI multilevel interconnections. Nov. 25, 1993. Thin Solid Films. vol. 235, Issues 1-2, pp. 80-85. Provided is abstract thereof.*

Homma et al. Electrical stability of polyimide siloxane films for interlayer dielectrics in multilevel interconnections. 1999. Thin Solid Films. vol. 340, pp. 237-241.*

T. Homma, "Fluorinated interlayer dielectric films in ULSI multilevel interconnections", Journal of Non-Crystalline Solids, 1995, 187, pp. 49-59.

T. Homma, "Stability of a new polyimide siloxane film as interlayer dielectrics of ULSI multilevel interconnections", Thin Solid Films, Nov. 25, 1993, vol. 235, Issues 1-2, pp. 80-85. Provided is abstract thereof.

T. Homma, "Electrical stability of polyimide siloxane films for interlayer dielectrics in multilevel interconnections", Thin Solid Films, 1999, vol. 340, pp. 237-241.

Nguyen Nhu Toan, "Spin-on-glass materials and applications in advanced IC technologies", 1999, retrieved from the Internet, URL:http://doc.utwente.nl/1409/.

* cited by examiner

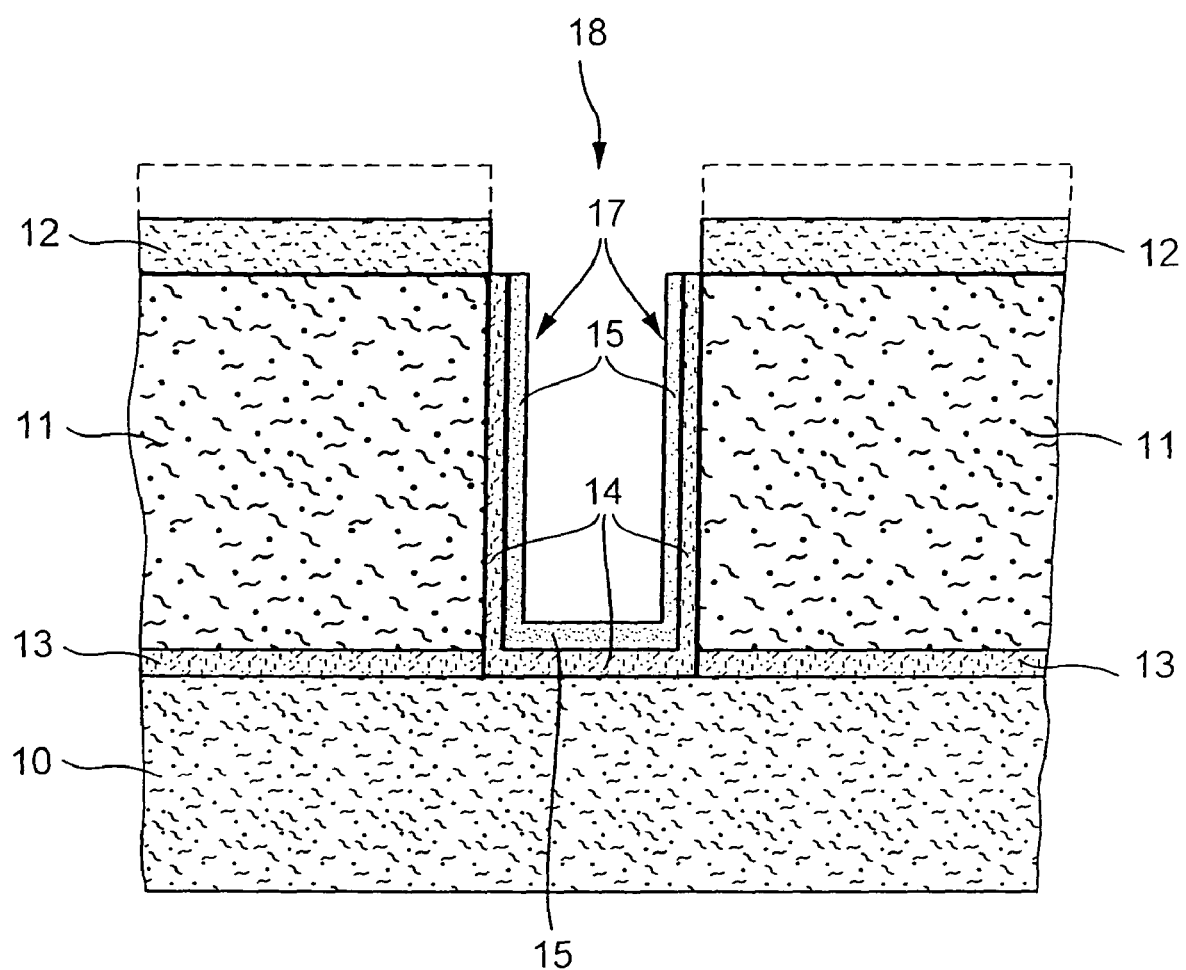

LAYER SYSTEM COMPRISING A SILICON LAYER AND A PASSIVATION LAYER, METHOD FOR PRODUCTION A PASSIVATION LAYER ON A SILICON LAYER AND THE USE OF SAID SYSTEM AND METHOD

FIELD OF THE INVENTION

The present invention relates to a layer system having a silicon layer and a passivation layer, a method for creating a passivation layer on a silicon layer and use of this layer system or this method.

BACKGROUND INFORMATION

In a method known, for example, from German Patent No. 44 20 962, for manufacturing self-supporting MEMS structures (MEMS="micro electromechanical structures") by combining anisotropic and isotropic etching processes, trenches or deep structures having perpendicular side walls are initially anisotropically etched into a silicon substrate using a reactive plasma. After achieving the intended etch depth and subsequent to a longer lasting passivation step for removing a PTFE-like film, a longer lasting etching step is carried out in which the etch bottom of the trench is initially cleared of a formed PTFE polymer via sputtering, followed by an isotropic underetching of the self-supporting MEMS structures to be created. Due to the previously applied PTFE-like film, the perpendicular side walls of the trenches remain protected from an etch attack during this isotropic underetching. According to German Patent No. 44 20 962, the isotropic underetching of the created MEMS structures proceeds in the silicon as the substrate material in a purely time-controlled manner.

A fluorohydrocarbon having an as low as possible fluorine/carbon ratio of preferably 2:1, particularly preferably less than 2:1, for example 1.5:1, is used for depositing the PTFE-like film; fluorohydrocarbons such as $C_4F_6$, $C_5F_8$, $C_4F_8$, or $C_3F_6$ are particularly suitable for this purpose. A per se isotropically etching and fluorine-delivering process gas, such as $SF_6$, is preferably used for etching silicon.

German Published Patent Application No. 198 47 455 proposes vertically limiting the isotropic underetching during an isotropic underetching over buried oxide layers. Using an intermediate oxide, which separates the MEMS structure from a sacrificial layer made of silicon, an etch attack on the MEMS structures is prevented according to this publication. In addition, it is described there that, instead of using fluorine radicals from a plasma discharge, the isotropic underetching may also be performed using spontaneously and plasmaless silicon-etching fluorine compounds, such as $XeF_2$, $ClF_3$, or $BrF_3$. After adsorption and chemisorption on a silicon surface, these compounds spontaneously separate fluorine radicals, which results in an isotropic removal of the etch-material of the silicon due to the formation of silicon tetrafluoride. At the same time, a very high selectivity is established with respect to non-silicon materials, such as PTFE-like or otherwise composed passivation layers. Photo resist in particular is attacked by $ClF_3$ in a practically immeasurable manner, so that parts of a silicon wafer not to be etched are able to be passivated in a particularly simple manner while at the same time very thin passivation layers are already sufficient to ensure complete protection from an etch attack. The "native" silicon oxide, which as a rule is already present on silicon surfaces, is in many cases capable of withstanding a chlorine trifluoride attack for minutes without the silicon situated below being etched.

A further aspect in the use of $ClF_3$, and to a limited degree also $BrF_3$, is the inherently low reactivity of these high-oxidizing fluorine compounds vis-à-vis silicon which results in the fact that etching, carried out with these etchants, proceeds via an additional parameter area in a reaction-controlled manner and is not limited by a substance transport. Insofar, large undercut widths may also be achieved without a decrease in the etch rate due to an increasing aspect ratio of the undercut channels. By using these gases, $ClF_3$ in particular, it is possible for example that the lateral expansion of the undercut channels constitutes a multiple, 100 to 1,000 for example, of its vertical expansion without adverse effects on the etching process.

Finally, isotropic etching using these gases takes place entirely without an ion effect which is a great advantage with respect to the intended isotropy and selectivity vis-à-vis non-silicon materials.

Overall, $ClF_3$ is in many respects an ideal gas for selective removal of silicon or porous silicon within the scope of sacrificial layer technology, so that self-supporting diaphragm structures may be implemented very easily with minor limitations to the freedom of design. Even a single etch opening is sufficient in many cases to achieve a complete underetching of a diaphragm area on porous silicon, for example.

However, the use of $ClF_3$, and with limitation also $BrF_3$, has the disadvantage that it easily spreads in an uncontrolled manner over micro-channel structures or even nano-channel structures, so that there is a significant risk of it creeping extremely quickly behind applied passivation layers, side wall passivation layers according to German Patent No. 42 41 045 for example, via micro-cracks or nano-cracks in the border surface area to the silicon.

It has been found that a PTFE-like plasma passivation layer, created from $C_4F_8$ or $C_3F_6$, has a sufficient number of micro-channels or nano-channels in the border surface area to the silicon situated below, that, starting from a single inlet opening, for example on the etch bottom of the initially created trench, a large area of the entire MEMS structure is exposed to a $ClF_3$ attack despite the applied PTFE-like passivation. A typical error image in this context is that structures, in which the etch bottom was previously cleared, supported by ions, of a passivating PTFE polymer according to German Patent No. 42 41 045, are massively etched on the entire, inherently passivated side wall surface, while structures, in which the etch bottom carries a rest of a PTFE-like polymer of only a few nanometers, do not show any sign of an etch attack, even after a long time. The cause of this problem is the explained micro-channels or nano-channels in the border surface area between the PTFE passivation, which adheres poorly to silicon, and the silicon surface which allow the etching gas $ClF_3$ access to the silicon in undesirable areas.

SUMMARY OF THE INVENTION

An object of the present invention is to provide a passivation layer on a silicon layer, as well as a method for creating such a passivation layer on a silicon layer which achieves increased passivation of the border surface between the passivation layer and the silicon layer by avoiding the formation, or alternatively via the sealing, of undesirable micro-scale or nano-scale channels via which an uncontrolled etch attack could otherwise take place, in particular via an isotropically etching gas, such as $ClF_3$ or $BrF_3$. In addition, the method and the resulting layer system including the passivation layer should be able to be integrated into plasma etching processes using photo resist masking for creating trenches and self-supporting structures.

The layer system according to the present invention and the method according to the present invention have the advantage over the related art that, via reactive passivation on the atomic or molecular level, in particular via inertization of the bonding places of a silicon surface, particularly effective protection is achieved for a silicon layer, in particular with respect to an etch attack via high-oxidizing fluorine compounds, such as $ClF_3$ or $BrF_3$, and that almost no micro-scale or nano-scale channels via which one of these gases could attack the protected silicon layer are present in the passivation layer. Therefore, the layer system and method according to the present invention are particularly suitable for use in creating structures in silicon which are at least largely or regionally self-supporting and which sometimes use anisotropic etch technology, according to German Patent No. 42 41 045 for example, or sometimes isotropic underetching technology, according to German Patent No. 44 20 962 or German Published Patent Application No. 198 47 455, for example.

Moreover, it is advantageous that the method and the layer system according to the present invention are able to be integrated into etching processes which use a photo resist mask for creating trenches so that one does not need to resort to a more expensive and more complex hard material masking which is basically not needed in these processes.

It is advantageous that the problem of a high-oxidizing fluorine compound creeping behind the border surface area between the passivation layer and the silicon layer may be effectively prevented in that the border surface area is initially sealed using a thin oxidic passivation, a second partial layer in the form of a "self-assembled monolayer" (SAM layer) being subsequently deposited thereon. This ensures that all reaction-capable bonding places of the silicon layer's surface are inertized and are attack-proof with respect to the high-oxidizing fluorine compounds. In the event that such a passivation layer turns out to be insufficiently thick for withstanding a longer lasting etching process, it may then advantageously be further reinforced via a PTFE-like layer additionally applied to the second partial layer.

A thin oxide layer of only 1 nm to 2 nm as the first partial layer, which originates from a plasma oxidation of the silicon layer's surface, represents a suitable passivation on the atomic level and high-oxidizing fluorine compounds would not creep behind it. However, because of its marginal thickness, this passivation would withstand an etch attack only for a short time. The attempt to reinforce a silicon surface's oxide passivation of only a few nanometers using a PTFE-like polymer, deposited by a plasma, in particular in connection with an as a rule unavoidable ionization of the structure side walls, results in damage to the oxide passivation.

One of many possible undesirable etch reactions in connection with process gas $C_4F_8$ for creating PTFE-forming monomers proceeds as follows:

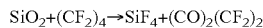

$SiO_2+(CF_2)_4 \rightarrow SiF_4+(CO)_2(CF_2)_2$

It is thus not possible to deposit a PTFE-like layer on an atomic silicon oxide passivation in the plasma with at least proximate conformity without having to accept damage or removal of the oxide passivation.

Moreover, it is particularly advantageous when the passivation of a silicon structure or silicon layer initially starts with an impact of a plasma made of silicon tetrafluoride and an oxygen carrier on the silicon substrate, the substrate being preferably pretreated prior to an $O_2$ cleaning step in a plasma stripper for removing organic residues, on side walls for example, and a subsequent plasma oxidation, of side wall surfaces for example. Following this optional pretreatment, due to a reaction of the silicon tetrafluoride with the oxygen carrier, a silicon-oxide layer having a thickness of 10 nm to 20 nm, for example, is grown over the possibly already existing native surface oxide on the silicon layer, or over the surface oxide on the silicon layer obtained via plasma oxidation, so that the first partial layer of the passivation layer is formed or its thickness is increased.

Furthermore, it has proven to be particularly advantageous when "self-assembled monolayers" (SAM layer) of organic fluorine silanes or organic fluorine chlorine silanes (known as "F-TCS"), such as $CF_3(CF_2)_nC_2H_2SiCl_3$, are used on the inorganic partial layer for passivation of the silicon surface. In addition, "self-assembled monolayers" (SAM) of the organic compound of the general formula $R_a—R_b—Si(X)_{3-n}—(R_c)_n$ are advantageous, $R_a$ being a perfluorinated polyether or a perfluorinated alkyl group having 1 to 16 carbon atoms, preferably 6 to 12 carbon atoms, $R_b$ being an alkyl spacer, a methyl spacer, or an ethyl spacer for example, $R_c$ being an alkyl group, a methyl group, or an ethyl group for example, and X being a halogen, an acetoxy group, or an alkoxyl group, and n having a value of 0 to 2. Particularly suitable are 1,2,2,2-perfluortetrahydrododecyltrichlorsilane, 1,1,2,2-perfluortetrahydrododecyltrimethoxysilane, 1,1,2,2-tetrahydroperfluordecyltrichlorsilane, 1,1,2,2-tetrahydroperfluordecyltrimethoxysilane, 1,1,2,2-tetrahydroperfluordecyltriacetoxysilane, 1,1,2,2-tetrahydroperfluordecyltriethoxysilane, 1,1,2,2-tetrahydroperfluoroctyltrichlorsilane, 1,1,2,2-tetrahydroperfluoroctyltrimethoxysilane, 1,1,2,2-tetrahydroperfluordecyltriethoxysilane, 1,1,2,2-perfluortetrahydrohexyltrichlorsilane, 1,1,2,2-perfluortetrahydrohexyltriethoxysilane, or 1,1,2,2-perfluortetrahydrohexyltrimethoxysilane. Moreover, also suitable are chlorine silanes or silanes having other functional groups, such as siloxanes having functional oxygen or OH groups, as marketed by Degussa AG under the trade name "Dynasilan-F."

It is particularly advantageous in the mentioned compounds that the inorganic, functional groups of the silane compound ensure the bond to the silicon or silicon oxide surface, while the (per) fluorinated organic alkyl chains form an inert, PTFE-like surface.

The separation of the mentioned "self-assembled monolayers" may advantageously be carried out from the gas phase as well as from the liquid phase with the aid of suitable solvents. For a gas phase separation, the compound to be used is vaporized to create the respective second partial layer of the passivation layer from the gas phase. Fluorine silane solvents such as n-heptane, n-hexane, or c-hexane, and preferably fluorocarbons, i.e., perfluorinated alkanes, such as marketed by the 3M company, lend themselves for a liquid phase separation. These fluorocarbons dissolve fluorine silanes very well, have an extremely low surface tension, may penetrate even the finest structures, and reach all surfaces to be passivated. Moreover, the separation from the gas phase as well as from the liquid phase is possible without damage to an existing silicon oxide as the first inorganic partial layer since these methods are performed in a plasmaless manner.

After application of a "self-assembled monolayer" (SAM layer), made of a fluorine silane for example, it may then, if needed, be advantageously selectively removed again via a short plasma etching, $SF_6$ or a $C_4F_8$ or Ar plasma etching for example, in particular in the area of the trench bottom, so that underetching of structures in the silicon may subsequently take place using high-oxidizing fluorine compounds, the applied fluorine silane in connection with the silicon oxide providing the required passivation, for example. In this case, only a molecular passivation is used which is composed of a layer combination of fluorine silane and silicon oxide and is typically only approximately 2 nm to 10 nm thick. Due to the excellent selectivity of high-oxidizing fluorine compounds, such as $ClF_3$ or $BrF_3$, vis-à-vis the PTFE-like surface of a fluorine silane, this passivation is sufficient for a limited undercut time which is adequate in many applications.

However, it is advantageous in many cases to reinforce the "primary" passivation by separating a substantially thicker, PTFE-like layer from a plasma discharge according to the method described in German Patent No. 42 41 045 using, for example, $C_4F_8$, or $C_3F_6$, or even $C_4F_6$, or $C_5F_8$ as the passivation gas providing PTFE-forming monomers. The two passivation gases mentioned last crosslink particularly well and advantageously form particularly dense PTFE layers which are diagonally crosslinked within themselves. This creates a PTFE-like film over the second partial layer without damaging the first inorganic partial layer due to the effect of ions and ($CF_2$) radicals. It is possible in particular, without attacking the first partial layer, to reinforce the passivation layer using, for example, a PTFE-like layer having a thickness of 100 nm to 200 nm so that a particularly dense passivation of a silicon surface is obtained which withstands an etch attack over a long period of time.

Finally, it is advantageous that the PTFE layer, separated in particular from a plasma, is particularly dense and also adheres excellently to the second partial layer, composed of a fluorine silane for example, which offers a PTFE-like surface in the form of perfluorinated alkyl groups and which adheres excellently to a silicon or silicon-oxide surface due to the functional silane group.

The second partial layer not only assumes the role of a primary surface passivation in this case, but also the role of an adhesive agent to an additional PTFE-like layer created thereon. This results not only in a dense, intact oxide interface on the silicon layer, but also in a thick, resistant, effectively adhering, surface-forming, PTFE-like layer on the second partial layer.

BRIEF DESCRIPTION OF THE DRAWING

The FIGURE shows a schematic sketch of a section of a layer system having structuring in the form of a trench.

DETAILED DESCRIPTION

An exemplary embodiment of a layer system having a silicon layer and a passivation layer applied on the surface in certain areas and a method for creating such a passivation layer on a silicon layer are explained in the FIGURE. In particular, one starts initially from a silicon wafer having a layer system, suitable for processing according to German Published Patent Application No. 197 47 455, and including buried oxide layers, polysilicon layers, and a functional silicon layer, a photo resist masking defining the structures to be created in the silicon layer being applied thereto.

A first silicon layer 10, made of polysilicon for example, is provided on a substrate (not shown in the FIGURE) and possibly existing buried oxide layers, a separating layer 13, made of silicon oxide for example, being situated on first silicon layer 10. A second silicon layer 11 as a functional silicon layer, a photo resist mask 12 being situated thereon, is applied to separating layer 13. Moreover, the FIGURE shows that, with the aid of photo resist mask 12, a trench 18 was etched in certain areas into second silicon layer 11, the trench extending to first silicon layer 10, i.e., the trench also crosses separating layer 13.

In fact, after photo-processing for creating photo resist mask 12, trench 18 is etched into second silicon layer 11 using the process according to German Patent No. 42 41 045, the second silicon layer being made of epipolysilicon having a thickness of 11 μm. This process automatically stops at separating layer 13 made of an isolation oxide which, according to the teaching of German Published Patent Application No. 198 47 455, separates functional second silicon layer 11 from first silicon layer 10. In the area of trench 18, the thickness of first separating layer 13 is 50 nm to 100 nm, for example. Second silicon layer 11 is used, for example, for creating self-supporting structures therein.

Via a subsequent oxide etching step, separating layer 13 is initially etched through selectively with respect to the silicon and selectively with respect to the photo resist masking from the trench process according to German Patent No. 42 41 045 with the aid of a plasma.

For example, $CHF_3$, $C_2F_6$, $C_3F_6$, $C_4F_6$, $C_5F_8$, $C_xF'_y$, or a mixture of these gases with $CF_4$ is used as a suitable, selectively acting process gas. $C_4F_8$ or a mixture of $C_4F_8$ and $CF_4$ is preferably used for the oxide etching step. The addition of $CF_4$ is primarily used to control polymer formation, i.e., of $SiO_2$, in the plasma during etching of separating layer 13; it must be pointed out, however, that an addition of $CF_4$ results in a deterioration of the selectivity of the etching of $SiO_2$ with respect to silicon or photo resist.

After etching through separating layer 13 and after a relative stop of the oxide etching process at first silicon layer 10, undefined PTFE-like layers on the side walls or on the bottom of trench 18, such as may still exist from the previously executed process according to German Patent No. 42 41 045, are initially removed using an oxygen plasma. The cleared silicon surfaces are subsequently checked and provided with an oxide as dense as possible, preferably silicon oxide. The initial or native oxide was preferably created via surface oxidation during the preceding $O_2$ plasma discharge for removing polymer residuals.

Subsequent to the plasma etching step for etching separating layer 13, the wafer having the layer structure according to FIG. 1 is initially subjected to a plasma oxidation, preferably in an $O_2$ plasma stripper. In the acidic plasma present there, undefined PTFE-like residuals are removed and silicon surfaces accessible therein are oxidized so that a dense surface oxide is formed.

Using a silicon oxide, preferably deposited thereon directly thereafter via the process according to German Published Patent Application No. 197 06 682, i.e., with the aid of $SiF_4$ and an oxygen carrier, this "grown" surface oxide on first silicon layer 10 and second silicon layer 11, respectively, may be initially reinforced. A first inorganic partial layer 14, which in the explained example is composed, at least approximately, of silicon dioxide ($SiO_2$), is formed on the side walls of second silicon layer 11 and on the accessible surface of first silicon layer 10 according to the FIGURE.

Moreover, it should be pointed out that during the removal of the PTFE-like residuals of the pre-process and the surface oxidation in the oxygen plasma stripper, photo resist mask 12 is inevitably also partially removed so that its thickness is reduced. This is indicated in the FIGURE by a dashed line which represents the greater thickness of photo resist mask 12 prior to the state according to the FIGURE. This process must be executed in particular in such a way that a sufficiently thick photo resist mask 12 remains for the following process, i.e., a photo resist mask 12, for example, having a thickness of 200 nm to 500 nm, starting from an original thickness of 1,000 nm to 2,000 nm.

The surface of first inorganic partial layer 14 is hydrophilized in a subsequent step. For this purpose, Si—OH groups are generated on the silicon-oxide surface under the effect of water in the explained example. This is accomplished, for example, by immersing the silicon wafer, treated as explained above, in a water bath for one hour, for example. The silicon wafer is preferably inserted into a reaction chamber, already prepared, for example, for creating second partial layer 15, and treated therein using water vapor. This approach yields the intended hydrophilic effect without requiring subsequent removal of accumulated liquid, out of narrow trenches in particular. Moreover, it is advantageous if, prior to or during hydrophilizing, the water vapor is additionally subjected to a plasma activation, since this increases the effectiveness with regard to the intended hydrophilic effect. A sufficient hydrophilic treatment, i.e., sufficient formation of OH groups on the surface, is very conducive for the reliable application of subsequently created second partial layer 15 and its sealing effect.

Following this method step and removal of the water vapor from the reaction chamber, via evacuation or annealing for example, the organic fluorine silane or fluorochlorine silane (F-TCS) selected for forming the "self-assembled monolayer" enters the reaction chamber. The occurring surface reactions may be described in the following as an example, one or multiple trichlorine silane molecule(s) is/are successively linked to OH groups of the surface of first partial layer 14, or are also crosslinked with one another:

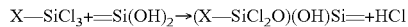

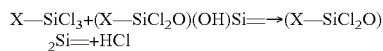

or

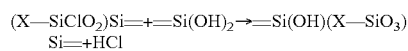

The designation "=Si(OH)$_2$" or "=Si" means that it is a silicon atom on the surface of first partial layer 14 linked to the solid which carries two hydroxyl groups on the surface and has two links "=" to other silicon atoms. X, for example, stands for a group of the formula $(CF_3)(CF_2)_nC_2H_2$— having a perfluorinated alkyl residue to generate a PTFE-like surface.

After formation of the "self-assembled monolayer" (SAM layer), the organic fluorine silane or fluorochlorine silane is pumped out of the reaction chamber and water vapor is subsequently let in again in order to remove non-reacted chlorine via HCl formation, thereby achieving that the formed "self-assembled monolayer," which defines second partial layer 15, no longer contains chlorine so that it may not cause any corrosion effects. In addition, cross-linking within second partial layer 15 is reinforced.

Instead of the explained gas phase reaction, it is also possible to carry out second partial layer 15, designed as a SAM, by immersing the pretreated silicon wafer in a solution of the used organic fluorine silane or fluorochlorine silane in a fluorocarbon, in the product no. FC43 of the 3M company, for example, or similar perfluoroalkanes. In this case, the preceding hydrophilic treatment and the subsequent removal of chlorine residuals is preferably carried out in a water bath, reliable drying between the individual steps being necessary.

An additional PTFE-like layer, i.e., a layer having the —$(CF_2)_n$— structure, may be optionally applied to second partial layer 15 via plasma polymerization according to German Patent No. 42 41 045. Since, due to the long perfluoroalkyl chains existing in the explained example, second partial layer 15 already has a thickness of typically 5 nm to 20 nm, no damage to first partial layer 14 occurs during the separation of the additional PTFE-like layer. The additional PTFE-like layer is preferably 50 nm to 300 nm thick, in particular 100 nm to 200 nm.

The passivation of silicon layer 11 via passivation layer 17 is now completed, so that access of high-oxidizing fluorine compounds such as $ClF_3$ to the passivation layer and unintentional undercutting of passivation layer 17 are prevented.

In summary, using the above explained method, a thin silicon-oxide layer as first inorganic partial layer 14 is initially deposited on first silicon layer 10, which is accessible in the area of the bottom of trench 18, and on second silicon layer 11, which is accessible in the area of the side walls of trench 18. Second partial layer 15 is thus situated on first inorganic partial layer 14; an additional layer in the form of a PTFE-like layer may optionally be provided on partial layer 15.

Based on the phase according to the FIGURE for creating a self-supporting MEMS structure, passivation layer 17, situated in a plasma on the bottom of trench 18, may initially be selectively penetrated with ion support via a comparatively short etching step using $SF_6$ or $CF_4$, $C_2F_6$, $CHF_3$, $C_4F_8$ or a mixture of these gases including $SF_6$ as an etching gas, followed by isotropic underetching of an MEMS structure to be uncovered with the aid of $ClF_3$ or $BrF_3$, i.e., a high-oxidizing fluorine compound. The underetching may be time-controlled or design-controlled via a lateral boundary of buried polysilicon islands which have to be removed. After completion of the underetching, the wafer is extracted from the etching chamber and remaining photo resist mask 12 and at least parts of passivation layer 17 are removed via re-stripping of $O_2$ plasma. Residuals of second partial layer 15 may remain without disadvantages for the functioning of the created MEMS structures. Furthermore, thin silicon-oxide layers may finally be removed via short overetching in an HF vapor in those areas where it is desired for reasons of reduced mechanical tension gradients, on the underside of an uncovered MEMS structure, for example. Thick oxide layers, which function as an insulating layer for example, are not affected by this short etching step in HF vapor.

What is claimed is:

1. A layer system, comprising:
an etched layer, whereby the etched layer is a silicon layer; and
a passivation layer applied at least regionally to a surface of the silicon layer, wherein:
the passivation layer includes a first, at least largely, inorganic partial layer and a second partial layer, and the second partial layer is made of an organic compound,
wherein the organic compound has the general formula $R_a$—$R_b$—$Si(X)_{3-n}$—$(R_c)_n$, $R_a$ being a perfluorinated polyether or a perfluorinated alkyl group having 1 to 16 carbon atoms, especially 6 to 12 carbon atoms, $R_b$ and $R_c$ being an alkyl group, and X being a halogen, an acetoxy group or an alkoxyl group, and n having a value of 0 to 2.

2. A layer system, comprising:
an etched layer, whereby the etched layer is a silicon layer; and
a passivation layer applied at least regionally to a surface of the silicon layer, wherein:

the passivation layer includes a first, at least largely, inorganic partial layer and a second partial layer, the second partial layer is made of an organic compound, wherein the organic compound includes a silane corresponding to one of an organic fluorine silane, an organic fluorochlorine silane, and a siloxane, and the second partial layer is a self-assembled monolayer.

3. The layer system as recited in claim 2, wherein the organic compound contains a halogen.

4. The layer system as recited in claim 2, wherein the first partial layer is at least largely composed of an oxide layer having a silicon oxide.

5. The layer system as recited in claim 2, wherein the first partial layer has a thickness of 1 nm to 100 nm.

6. The layer system as recited in claim 2, wherein the first partial layer has a thickness of 1 nm to 20 nm.

7. The layer system as recited in claim 2, wherein the first partial layer is directly applied one of (a) to the silicon layer and (b) on a layer of silicon oxide situated on the silicon layer.

8. The layer system as recited in claim 2, wherein the second partial layer has a thickness of 0.5 nm to 30 nm.

9. The layer system as recited in claim 2, wherein the second partial layer has a thickness of 5 nm to 20 nm.

10. The layer system as recited in claim 2, wherein the passivation layer protects the silicon layer with respect to an etch attack by a gaseous halogen fluoride including one of $ClF_3$ and $BrF_3$.

11. The layer system as recited in claim 2, wherein the passivation layer is free of micro-scale or nano-scale channels which are permeable for a gas including one of $ClF_3$, $BrF_3$ and a vapor.

* * * * *

UNITED STATES PATENT AND TRADEMARK OFFICE
CERTIFICATE OF CORRECTION

| | | |
|---|---|---|
| PATENT NO. | : 7,872,333 B2 | Page 1 of 1 |
| APPLICATION NO. | : 10/524610 | |
| DATED | : January 18, 2011 | |
| INVENTOR(S) | : Laermer et al. | |

It is certified that error appears in the above-identified patent and that said Letters Patent is hereby corrected as shown below:

On the title page, item (30) Foreign Application Priority Data, change "Aug. 17, 2003" to --Aug. 17, 2002--.

Signed and Sealed this
Fourth Day of October, 2011

David J. Kappos
*Director of the United States Patent and Trademark Office*